(12) United States Patent
Chen et al.

(10) Patent No.: US 7,155,696 B2
(45) Date of Patent: Dec. 26, 2006

(54) INTERCONNECTION ROUTING METHOD

(75) Inventors: Bih-Cherng Chen, Hsinchu (TW); Hsing-Chien Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 276 days.

(21) Appl. No.: 10/847,147

(22) Filed: May 17, 2004

(65) Prior Publication Data
US 2005/0204323 A1 Sep. 15, 2005

(30) Foreign Application Priority Data
Mar. 10, 2004 (TW) .............................. 93106287 A

(51) Int. Cl.
*G06F 17/50* (2006.01)
(52) U.S. Cl. ...................................................... 716/12
(58) Field of Classification Search .................. 716/12
See application file for complete search history.

(56) References Cited

U.S. PATENT DOCUMENTS

| 5,596,506 A * | 1/1997 | Petschauer et al. ............ 716/5 |
| 5,883,812 A | 3/1999 | Fujii ........................... 364/490 |
| 5,972,241 A | 10/1999 | Johnson et al. ......... 252/299.61 |
| 6,353,917 B1 * | 3/2002 | Muddu et al. ................. 716/6 |
| 6,772,403 B1 * | 8/2004 | Sasaki ............................ 716/6 |

* cited by examiner

*Primary Examiner*—Jack Chiang
*Assistant Examiner*—Brandon W. Bowers
(74) *Attorney, Agent, or Firm*—Thomas, Kayden, Horstemeyer & Risley

(57) ABSTRACT

The present invention relates to a method of interconnection routing for preventing crosstalk. The method comprises the following steps. Providing an aggressor connection path as a first net. Providing a victim connection path according to the requirements of a second net. Determining a voltage ramp time of the aggressor connection path, a victim total length of the victim connection path, a coupled wire length between the aggressor connection path and the victim connection path, and an equivalent load corresponding to the victim connection path. Evaluating a noise metric according to the voltage ramp time, the victim total length, the coupled wire length and the equivalent load. Modifying the victim connection path to shorten the coupled wire length if the noise metric is greater than a pre-determined value. Finally designating the victim connection path as the second net if the noise metric is less than the pre-determined value.

5 Claims, 3 Drawing Sheets

INTERCONNECTION ROUTING METHOD

BACKGROUND OF THE INVENTION

1. Field of the Invention

The present invention relates to a method of interconnection routing for semiconductor chips, and more particularly to a method for preventing crosstalk by routing and evaluating the degree of crosstalk simultaneously.

2. Description of the Related Art

The connection path between components in a semiconductor integrated circuit has decreased with increased component quantity. Coupling between routing wires, known as crosstalk, can cause functional failures and timing degradation in a semiconductor integrated circuit. Crosstalk is more severe in deep sub-micron technologies, where neighboring wire coupling capacitance dominates the total net capacitance. Increased clock speed and reduced voltage supply in modern designs further worsen the problem.

Traditionally, to determine if a chip implementation will suffer from crosstalk, a circuit simulation is performed or a static analysis tool is run after placement and routing. If a problem is discovered, the nets are manually repaired to alleviate the crosstalk. In modern high density chip design, however, there may be numerous coupling issues found after the first placement and routing. The manual repair process is difficult and time-consuming. Additionally, repair of some nets may cause other nets to develop problems. In a worst-case scenario, there may be insufficient routing resources left to address all the issues.

The most efficient method of eliminating crosstalk in deep sub-micron chip design is to prevent problems during chip implementation, and omit testing after implementation. Thus eliminating post-route repairs to nets suspected of having crosstalk. There are various techniques such as cell sizing or buffer-insertion during placement to alleviate crosstalk. The effect, however, is limited due to lack of coupling data during the placement stage. Addressing crosstalk issues in the routing stage offers the best results, as all the data required for estimating coupling effects is available.

Several similar solutions were introduced in U.S. Pat. No. 5,883,812, one of which is to determine distance and coupling length between nets, yielding an approximate result. The method provided in U.S. Pat. No. 5,883,812, comprises the following steps. First a long connection path is installed in the middle of a connection channel. Another path is then installed around the connection channel, so as to reduce the number of cross points between the paths. This method, however, is unable to ensure the prevention of crosstalk.

A solution introduced in U.S. Pat. No. 5,972,41 is similar to the methods in U.S. Pat. No. 5,883,812, wherein problematic nets are placed first to ensure their safety, other nets are then placed normally. This method is equally incapable of guaranteeing that crosstalk will not occur.

An object of the present invention is to provide a method for preventing crosstalk by routing and evaluating simultaneously.

The present invention provides a method for a routing tool to prevent crosstalk in general nets utilizing a pre-determined noise database. The noise metrics are evaluated with respect to four modeling parameters, which are aggressor signal transition time, victim holding resistance, victim net total length, and coupled wire length. All four parameters can be quickly obtained during routing. To evaluate noise metrics during routing, a routing tool is not required to perform additional complex calculations; instead, existing data and simple geometric parameters are enough.

The method of the invention comprises the following steps. Providing an aggressor connection path as a first net. Providing a victim connection path according to the requirement of a second net. Determining a voltage ramp time of the aggressor connection path, a victim total length of the victim connection path, a coupled wire length between the aggressor connection path and the victim connection paths, and an equivalent load corresponding to the victim connection path. Evaluating noise metrics according to the voltage ramp time, the victim total length, the coupled wire length and the equivalent load. Modifying the victim connection path to shorten the coupled wire length if the noise metric is greater than a pre-determined value. Finally designating the victim connection path as the second net if the noise metric is less than the pre-determined value.

A further object of the present invention is to provide a coupling noise database, comprising several noise metrics, wherein each noise metric corresponds to a pre-determined set of parameters comprising a voltage ramp time of a aggressor connection path, a total length of a victim connection path, a coupled wire length between the aggressor connection path and the victim connection path, and an equivalent load corresponding to the victim connection path.

An advantage of the present invention is to accurately and simultaneously evaluate a noise metric between a victim connection path and an aggressor connection path while placing the victim connection path. Thus addressing crosstalk by preventing overflow of the noise metric.

A further advantage of the present invention is that the noise metric can be rapidly obtained. The noise metric of the next connection path can be determined quickly by effective information comparison, as nearly all parameters and corresponding noise metrics are recorded in a coupling noise database. Thus the total routing time is substantially reduced.

The following detailed description is given by way of example and not intended to limit the invention solely to the embodiments described herein.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

A detailed description of the present invention is provided in the following.

The object of the present invention is to evaluate noise metrics which a victim connection path might receive through at least four parameters (aggressor signal transition time $T_{ramp}$, victim net total length $L_{total}$, coupled wire length $L_{coupled}$, and equivalent load $R_{load}$). Thus making the noise metrics low enough to be acceptable by modifying the victim connection path.

Figure 1:
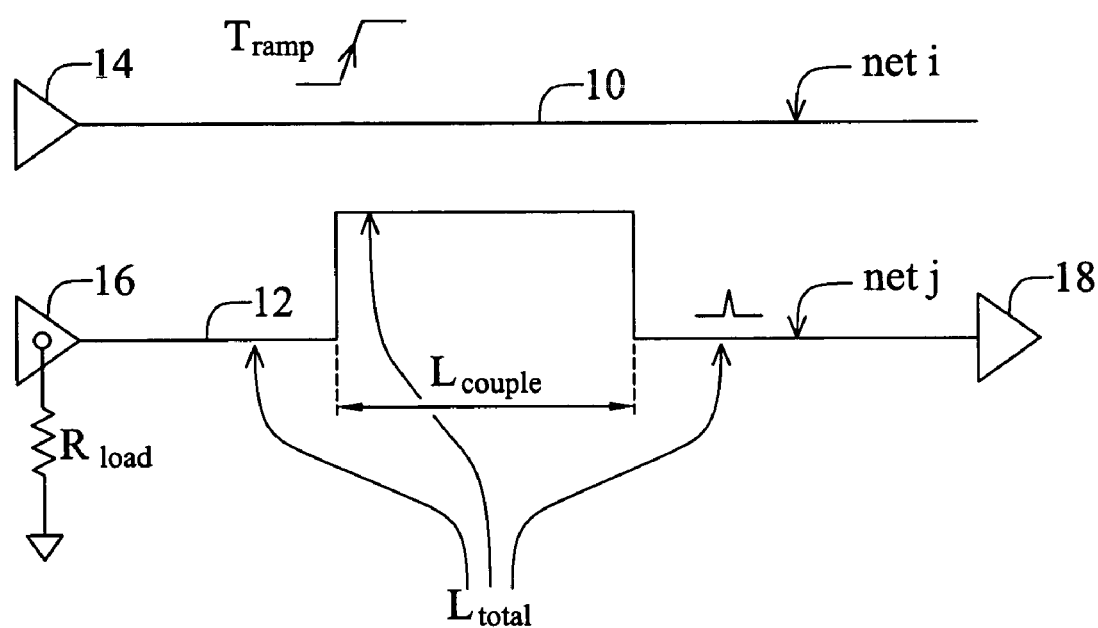
FIG. 1 is a drawing of four parameters used according to the present invention.

FIG. 1 is an illustration of the four parameters used according to the present invention. In the process of routing, connection paths are placed and routed one by one corresponding to the requirements of each net. There is high possibility that a newly placed connection path will have crosstalk with previously placed paths, hence the newly placed connection path is also designated as a victim, and the previous path an aggressor. In FIG. 1, the aggressor connection path 10 is placed according to the requirements of the net i, adjusted, and determined to be free of crosstalk. The aggressor connection path 10 is connected to an output of a component 14, for example, a voltage output or a current output, which is defined as an interference source due to the crosstalk it generates. The interference source is a known component of the electronic circuit, and the electronic properties (such as input resistance, output resistance, and output voltage ramp time, etc.) thereof can be obtained from the database generated through a simulation tool. $T_{ramp}$ is the output voltage ramp time of the interference source.

The victim connection path 12, connected to an input of a component 18 and a component 16, is a trial connection path placed to meet requirements of the net j after the aggressor connection path 10 has been placed. $L_{total}$ represents the total length of the victim connection path 12, and $L_{couple}$ stands for the length of the segment which has the least distance between the victim connection path 12 and the aggressor connection path 10. In other words, $L_{couple}$ is, the length of the segment which has a minimum line space allowable in the design specification, and the minimum line space is equal to the distance between the connection path 10 and 12. $R_{load}$ is a power equivalent resistance between the component 16 of the small signal model and the ground.

A worst case spice deck can be constructed from $T_{ramp}$, $L_{total}$, $L_{couple}$ and $R_{load}$, so as to run all spice simulations to evaluate the noise metric on the victim connection path 12. The spice deck is known as a composition of electronic circuits.

Figure 2:
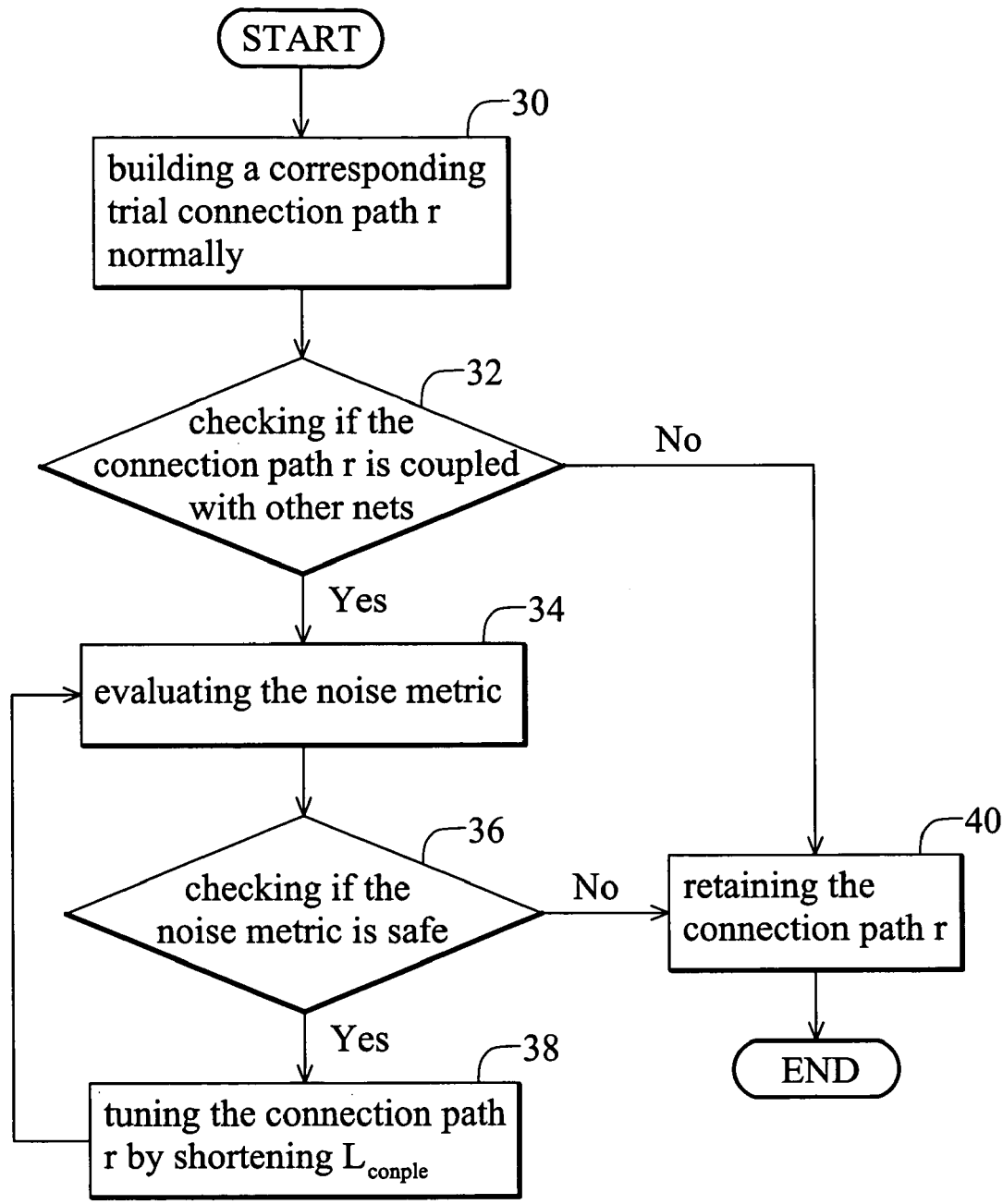
FIG. 2 is a flow chart of the method provided according to the present invention.

FIG. 2 is a flow chart of the method provided according to the present invention. First, according to the requirements of the nets, a corresponding trial connection path r is constructed through a traditional routing method (30). The traditional routing method, following design specifications, meeting the requirements of the shortest path, is a known solution to those in the art, and can be easily practiced. Subsequently, it is determined whether the connection path r is coupled with other previously placed nets (32). Coupling is a matter of degree. That is to say, the step in 32 determines whether the coupling degree is higher than a pre-determined level or not. A simpler method is to verify the distance between the connection path r and paths of other previously placed nets, and if the distance is equal to the minimum allowable line space defined in the design specification, coupling exists; otherwise if r is greater than the minimum allowable line space, there is no coupling. If the connection path r is not coupled with any other connection path, (no in 32) the procedure goes to step 40, wherein the connection path r is retained and the next routing process proceeds.

When the connection path r is found to be coupled with one of the other connection paths (yes in 32), $L_{total}$, $L_{couple}$, $R_{load}$ and $T_{ramp}$ of the coupled connection path are obtained, and the noise metric is evaluated (34). If the noise metrics is lower than a safety threshold, (no in 36), the connection path r is retained, and the next routing process proceeds.

Otherwise if the noise metric is over the safety threshold, then $L_{couple}$ is shortened by tuning the connection path r. After tuning, a new noise metric with new values of $L_{total}$, $L_{couple}$ and $R_{load}$ is evaluated, and the threshold checking is processed repeatedly until a proper value of the noise metric is obtained (no in 36), hence the wanted value r is retained (40).

Figure 3:
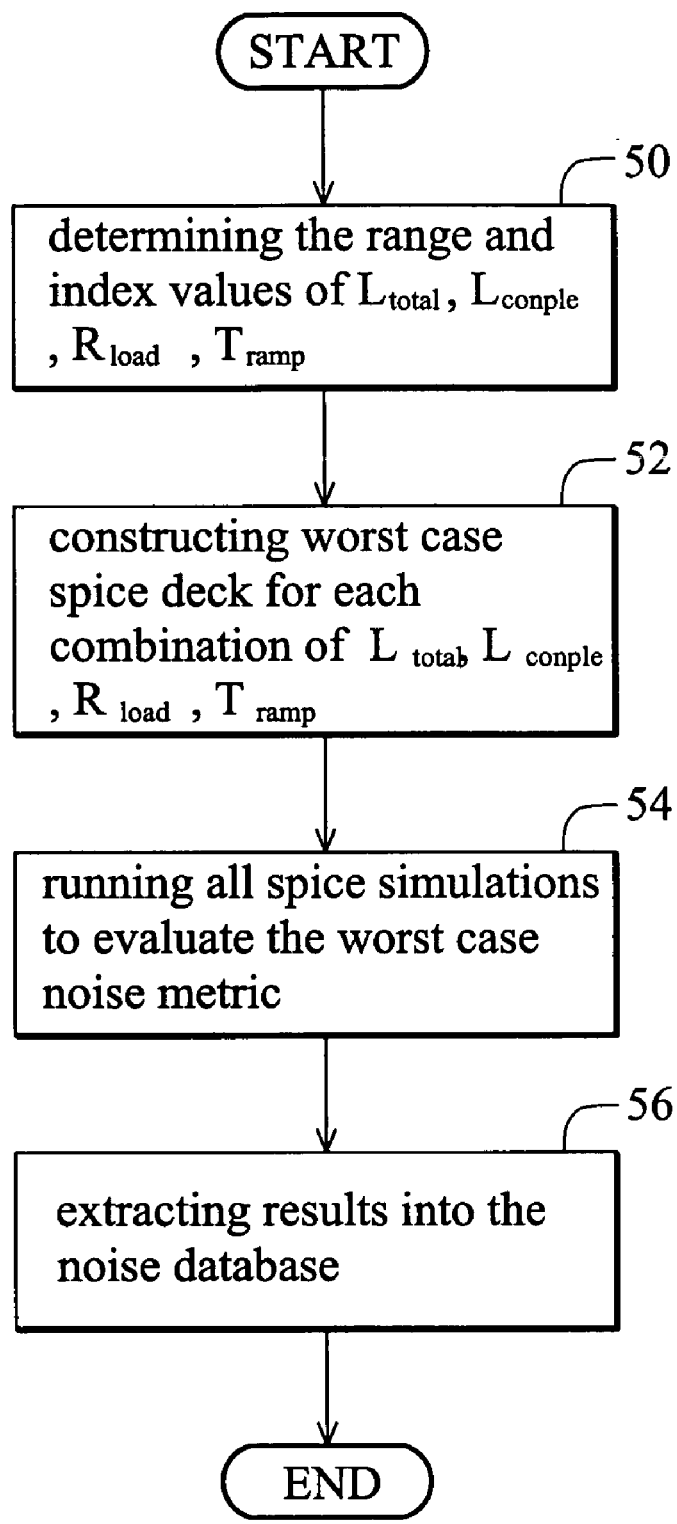
FIG. 3 is a detailed diagram of the process of characterizing a noise coupling database according to the present invention.

In order to minimize the computation time, a coupling noise database is provided for evaluation of the noise metrics of a newly placed connection path by direct information referencing. In brief, $L_{total}$, $L_{couple}$, $R_{load}$ and $T_{ramp}$ are given as parameters, a corresponding noise metric can be directly located from the coupling noise database. The method of creating a coupling noise database is shown on FIG. 3. First, ranges and values of the parameter sets ($L_{total}$, $L_{couple}$, $R_{load}$ and $T_{ramp}$) (50) are determined. Subsequently, a worst case spice deck from one of the parameter sets $L_{total}$, $L_{couple}$, $R_{load}$ and $T_{ramp}$ is constructed. By means of simulation tools, such as spice (Simulation Program of Integrated Circuit Emphasis), a worst case noise metric can be evaluated (54). Finally, data of all the noise metrics corresponding to those combinations of the sets are completing a coupling noise database.

During routing, if sets of $L_{total}$, $L_{couple}$, $R_{load}$ and $T_{ramp}$ are in the range defined by the coupling noise database, a corresponding noise metric by is determined by direct referencing. Otherwise the noise metric should be evaluated through a simulation tool by constructing a worst case spice deck. Thus most of the noise metrics are found by direct referencing, greatly reducing the computation time.

By using the four parameters $L_{total}$, $L_{couple}$, $R_{load}$ and $T_{ramp}$, the present invention directly checks noise metrics received from every newly placed connection path during the routing process, and properly tunes the connection path to prevent exceeding the noise metric. In this way the present invention prevents crosstalk.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of interconnection routing, comprising the following steps:

providing an aggressor connection path as a first net;

providing a victim connection path according to the requirements of a second net;

determining a voltage ramp time of the aggressor connection path, a victim total length of the victim connection path, a coupled wire length between the aggressor connection path and the victim connection path; and an equivalent load corresponding to the victim connection path;

evaluating a noise metric according to the voltage ramp time, the victim total length, the coupled wire length and the equivalent load;

modifying the victim connection path to shorten the coupled wire length if the noise metric is greater than a pre-determined value; and making the victim connection path the second net if the noise metric is less than the pre-determined value; wherein the noise metric is obtained by searching a coupling noise database according to the voltage ramp time, the victim total length, the coupled wire length and the equivalent load.

2. The method as claimed in claim 1, further comprising the following step:
designating the victim connection path as the second net if the victim connection path and the aggressor connection path are uncoupled.

3. The method as claimed in claim 1, wherein the aggressor connection path is connected to an interference source, and the victim connection path is connected to an input of a component.

4. The method as claimed in claim 1, wherein the equivalent load is an output resistance of an output of a component connected to the victim connection path.

5. The method as claimed in claim 1, further comprising steps of:

constructing several sets of parameters by picking several pre-determined voltage ramp times, several pre-determined victim total lengths, several pre-determined coupled wire length and several pre-determined equivalent loads;

building a worst case spice deck corresponding to each set of parameters;

evaluating a corresponding noise metric of the worst case spice deck; and characterizing a coupling noise database by collecting data of the corresponding noise metric.

* * * * *